United States Patent
Moore et al.

(10) Patent No.: US 7,228,894 B2
(45) Date of Patent: Jun. 12, 2007

(54) HEAT SPREADER WITH CONTROLLED Z-AXIS CONDUCTIVITY

(75) Inventors: David A. Moore, Tomball, TX (US); Mark Tracy, Tomball, TX (US); Kerry Hill, Houston, TX (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 418 days.

(21) Appl. No.: 10/836,511

(22) Filed: Apr. 30, 2004

(65) Prior Publication Data

US 2005/0241817 A1 Nov. 3, 2005

(51) Int. Cl.
F28F 7/00 (2006.01)

(52) U.S. Cl. ...................... 165/185; 165/80.2

(58) Field of Classification Search ............... 165/185, 165/80.1, 80.2; 361/704, 705
See application file for complete search history.

(56) References Cited

U.S. PATENT DOCUMENTS

| | | | | |
|---|---|---|---|---|
| 4,810,563 | A * | 3/1989 | DeGree et al. | 165/185 |
| 5,991,155 | A * | 11/1999 | Kobayashi et al. | 165/80.2 |
| 6,288,900 | B1 * | 9/2001 | Johnson et al. | 165/185 |
| 6,358,595 | B1 * | 3/2002 | Kobayashi | 165/185 |
| 6,462,410 | B1 | 10/2002 | Novotny et al. | |
| 6,982,874 | B2 * | 1/2006 | Smalc et al. | 165/185 |
| 2006/0086487 | A1 * | 4/2006 | Yang et al. | 165/185 |

FOREIGN PATENT DOCUMENTS

| | | |
|---|---|---|
| JP | 08222668 A | 12/1996 |
| JP | 09097872 A | 8/1997 |

OTHER PUBLICATIONS

Fibrous-Ceramic/Aerogel composite Insulating Tiles; NASA Tech Briefs, May 2004.
Fibrous-Ceramic/Aerogel composite Insulating Tiles; www.techbriefs.com/briefs/May04/ARC12070.HTML; Ames Research Center, Moffett Field, California.
Webpage—Aspen Aerogel—"A Breakthrough in Advanced Materials" Apr. 22, 2004—3 pages.
Webpage—IPAC @LLNL—"Thermal Properties of Aerogels" Apr. 22, 2004—2 pages.
Webpage—Ernest Orlando Lawrence Berkeley National Laboratory—"Thermal Properties of Silica Aerogels" —Apr. 22, 2004—4 pages.

(Continued)

*Primary Examiner*—Teresa J. Walberg

(57) ABSTRACT

A device for distributing waste heat from a heat source evenly across an exterior surface of an enclosure is disclosed. The device includes a first layer of material that has a high thermal conductivity along a first plane. One or more layers of material that include a controlled thermal conductivity along a second plane are connected with the first layer. At least one of those layers has a low thermal conductivity (e.g. a thermal insulating material) in the second plane and that layer is positioned between the heat source and the enclosure so that heat flow through that layer is substantially inhibited in the second plane and a majority of the waste heat is thermally transferred through the first layer along the first plane to the exterior surface where the waste heat is uniformly distributed thereby reducing hot spots on the exterior surface which can cause user discomfort.

32 Claims, 12 Drawing Sheets

OTHER PUBLICATIONS

Webpage—Aspen Aerogels—"Aerogels Are Extraordinary Solid Insulators" Apr. 22, 2004—3 pages.
Webpage—NASA Tech—"Improved Aerogel-Based Thermal Insulation Systems"—Apr. 22, 2004—2 pages.
Webpage—eGraf—"Typical eGraf SpreaderShield Material Properties" Technical Bulletin: 308-1 page.
Webpage—eGraf—Typical Properties of eGraf 700 Materials—Technical Bulletin: 272M—1 page.
GrafTech—High Performance, Lightweight Graphite Heat Sinks/Spreaders—May 2002—4 pages—IEEE—Power Electronics—Thermal Management and Packaging.

* cited by examiner

A: 97C hot spot
B: 22.6C

200

A: 82.1C hot spot
B: 25.3C

200

A: 41.9C hot spot
B: 32.3C

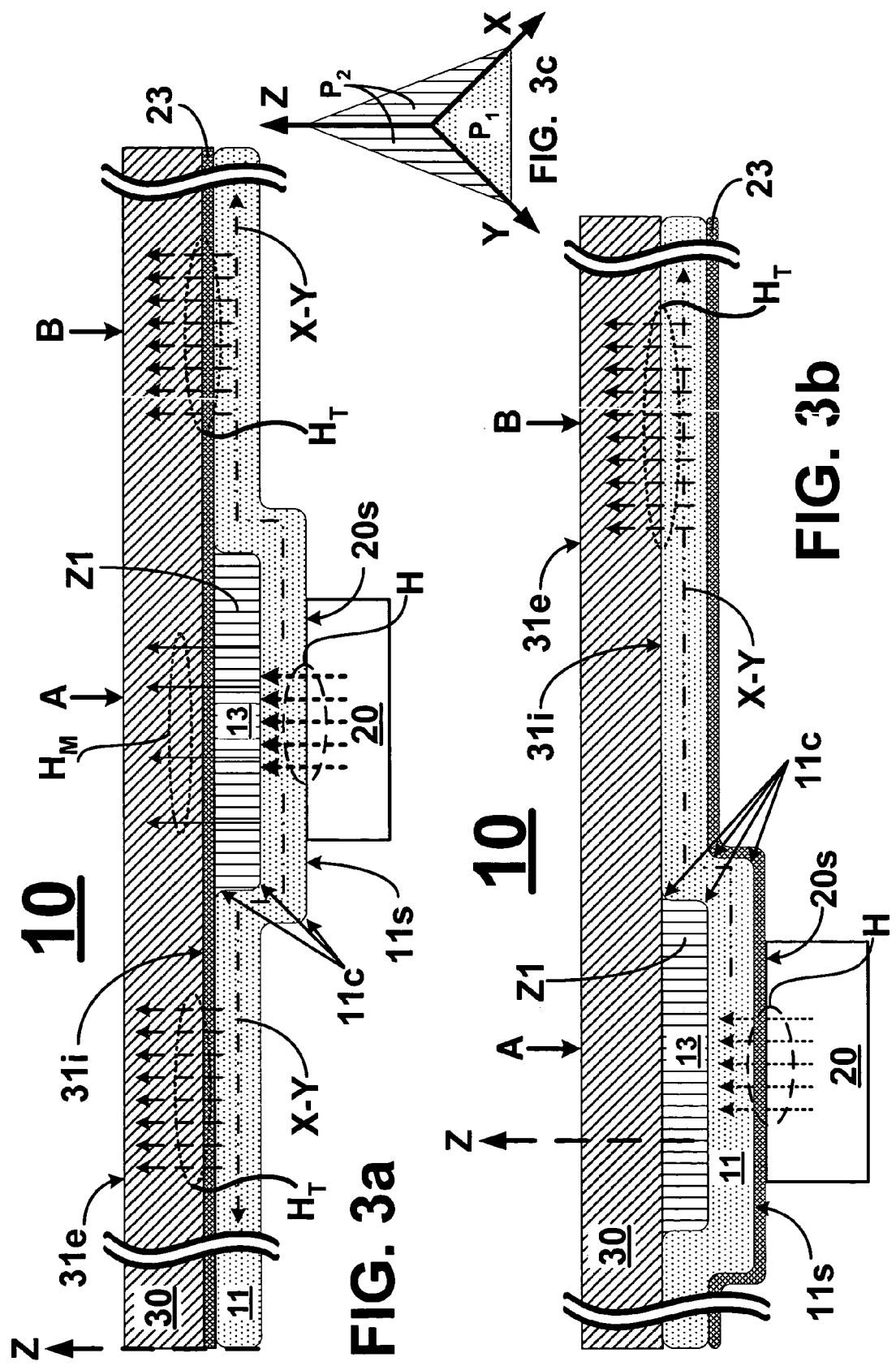

A: 41.9C hot spot
B: 31.4C

A: 59.4C hot spot
B: 44.5C

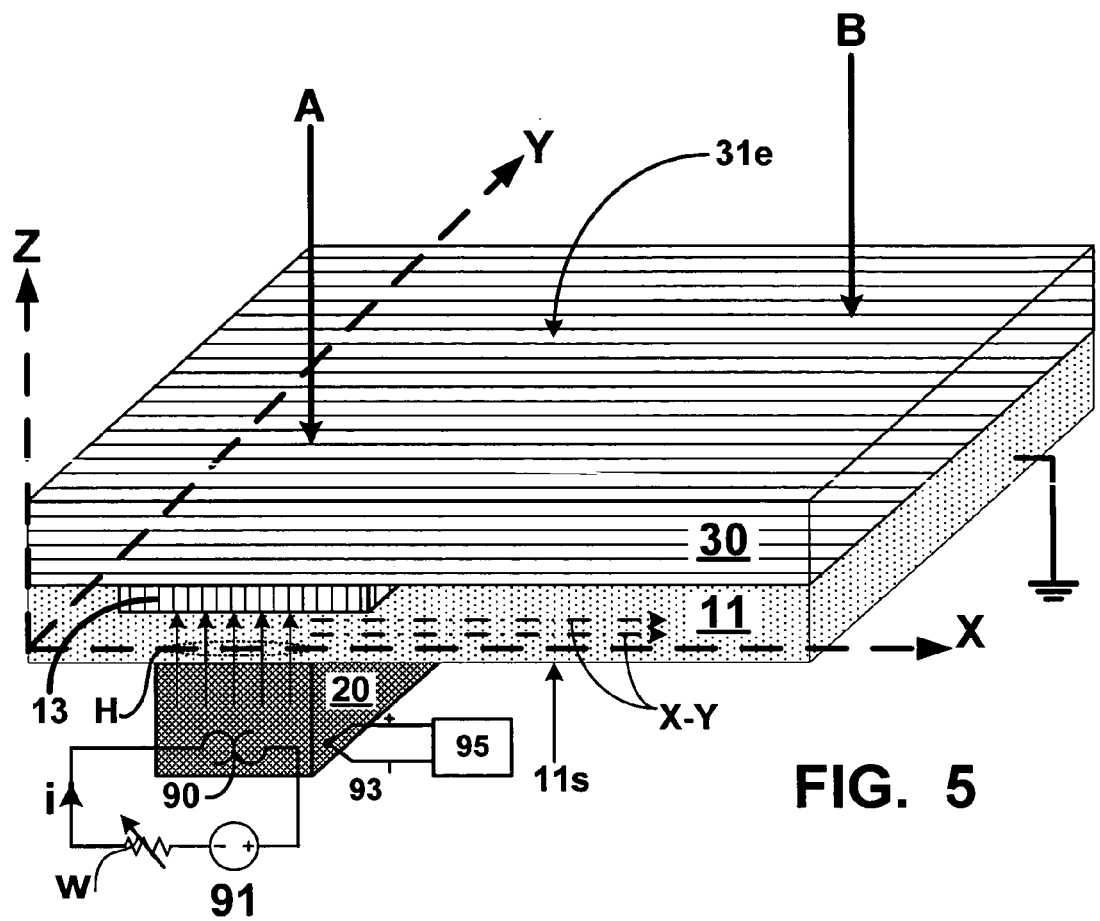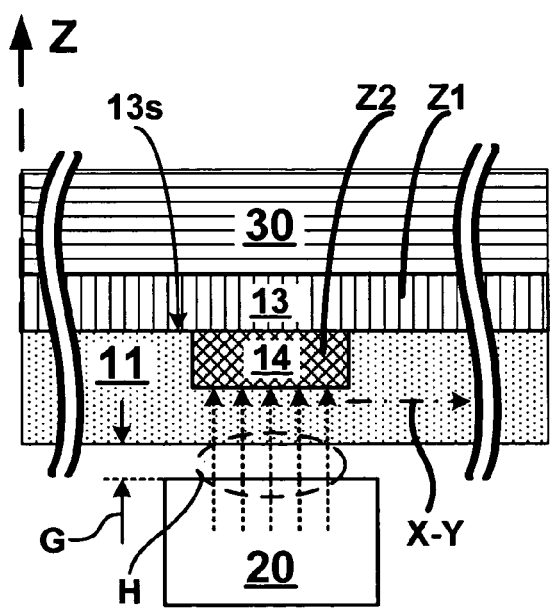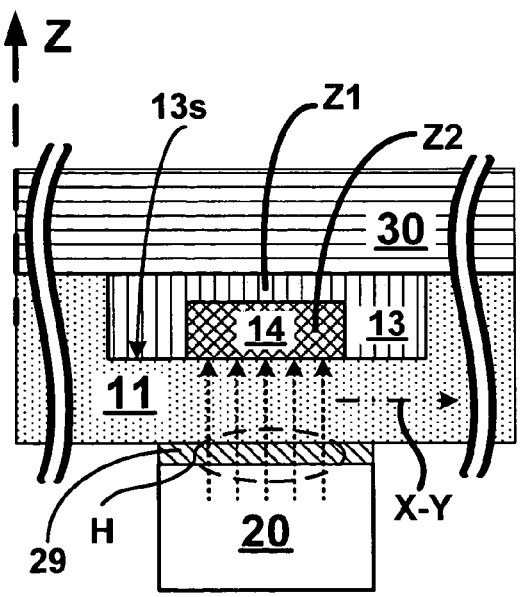

A: 36.6C hot spot
B: 33.1C

A: 54.1C hot spot
B: 46.3C

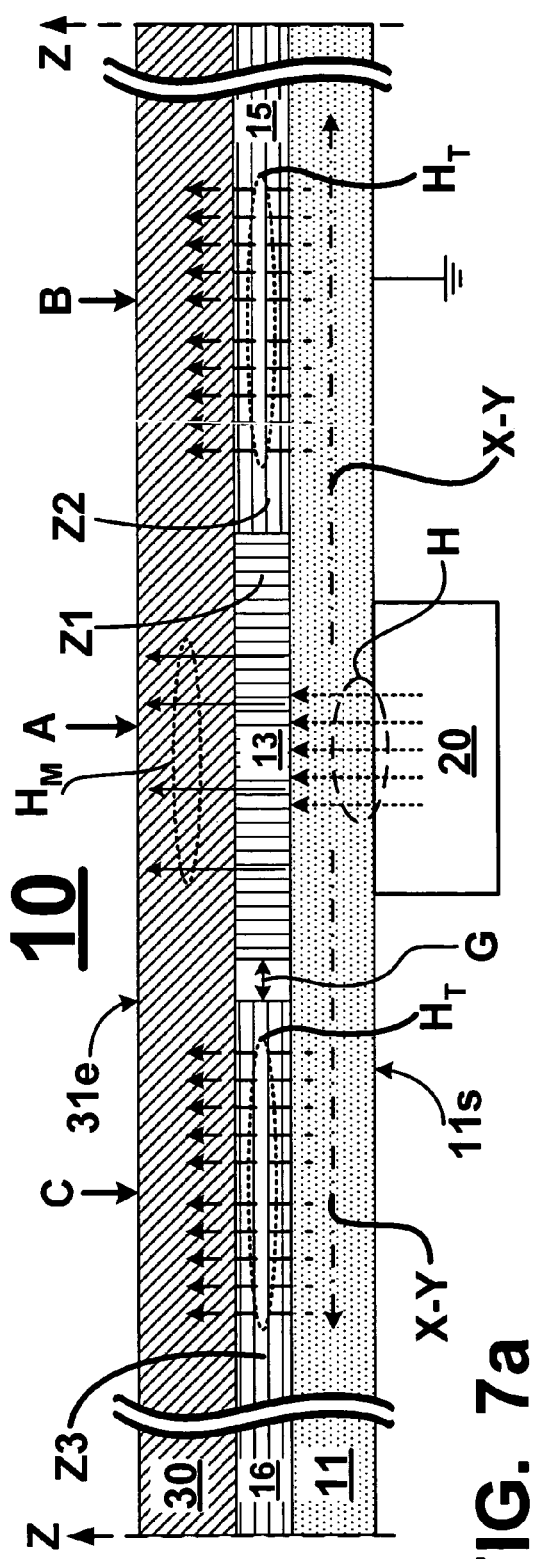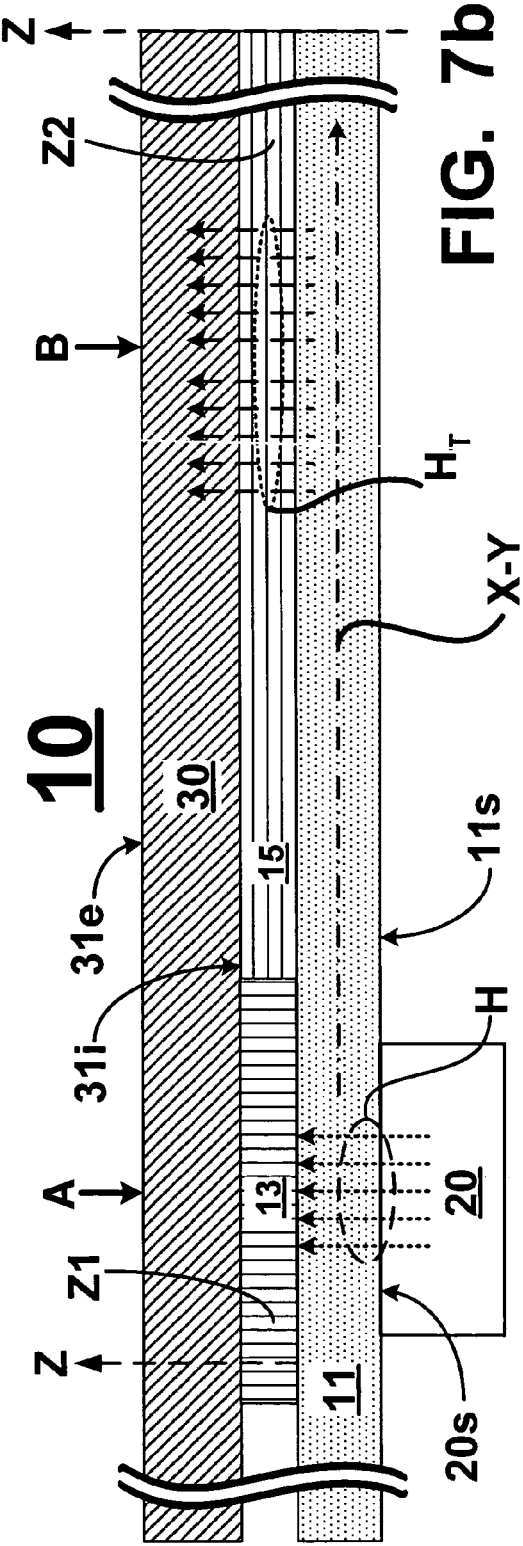

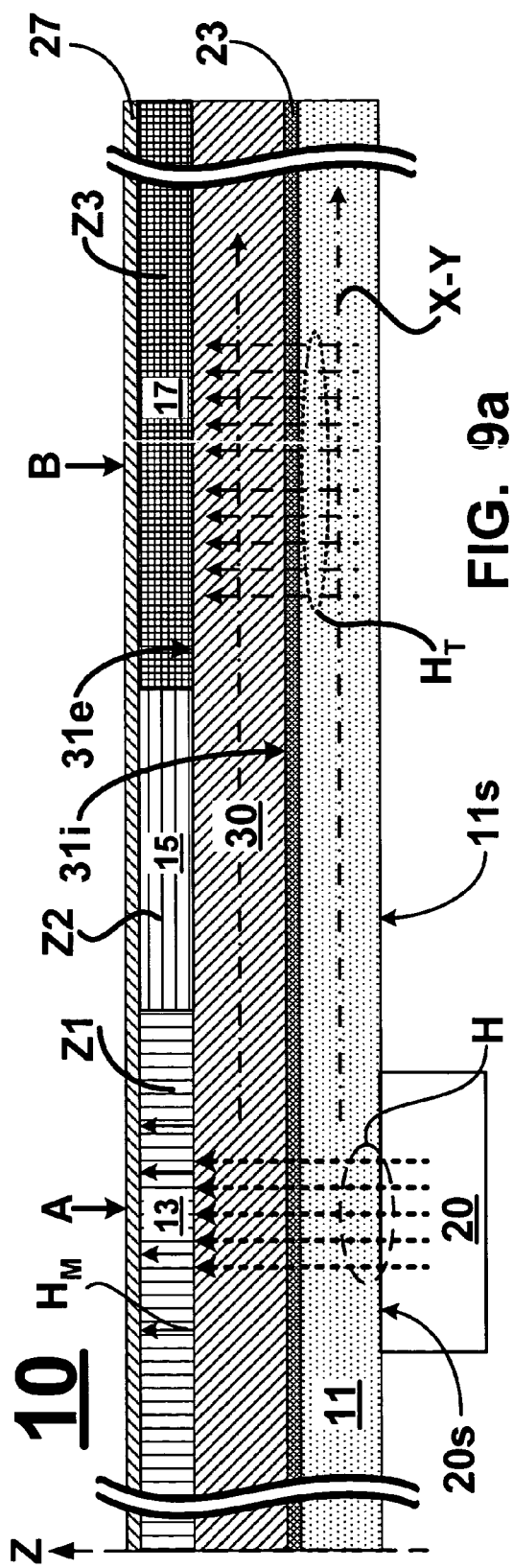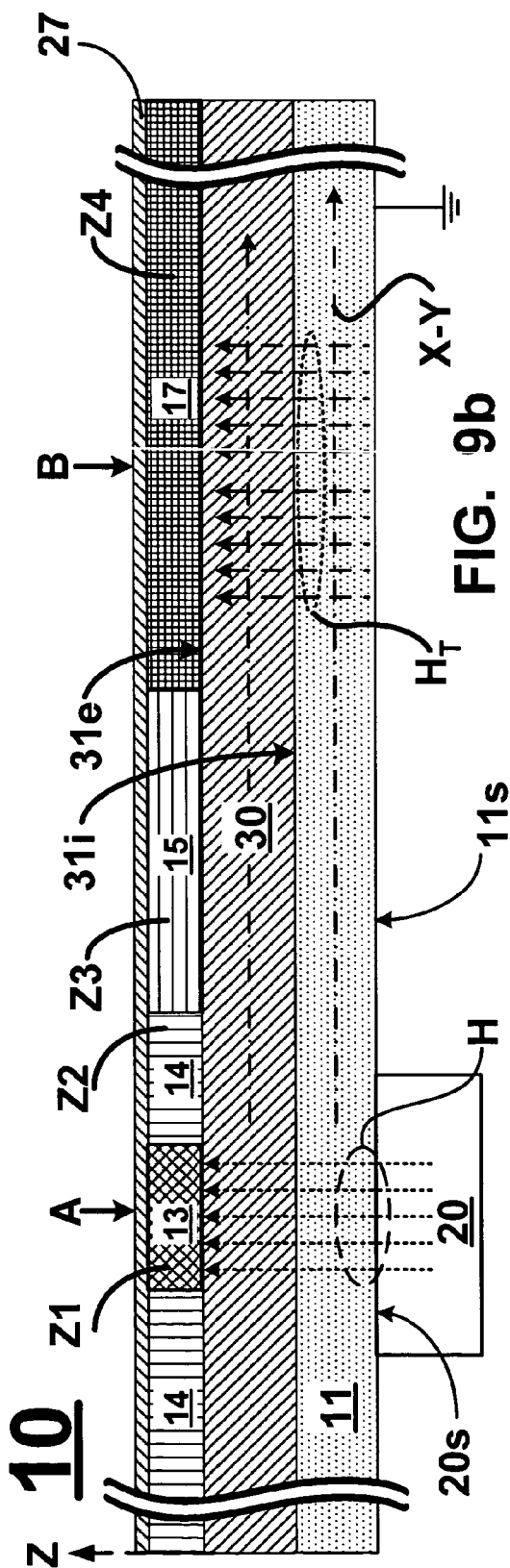

HEAT SPREADER WITH CONTROLLED Z-AXIS CONDUCTIVITY

FIELD OF THE INVENTION

The present invention relates generally to a heat spreader for removing heat from a heat source. More specifically, the present invention relates to a heat spreader including a high thermal conductivity in a first axis and a second axis and a controlled thermal conductivity in a third axis.

BACKGROUND OF THE ART

Electronic systems often include various heat generating devices such as microprocessors, hard disc drives, graphics processors, memory chips, and power supplies, and power converters, just to name a few. Waste heat generated by those devices must be effectively removed by a thermal management system or those devices will fail or otherwise become unreliable due to operating temperatures that exceed design limits. Typically, waste heat is removed from an enclosure that houses the devices through several paths. In many cases the system includes a fan that moves air over the devices to remove waste heat through convection cooling. A significant fraction of the waste heat can be removed using convection cooling. Another significant heat removal path is through the materials that comprise an enclosure that houses the heat generating devices. Waste heat in an interior of the enclosure is thermally conducted to an outer surface of the enclosure and into the ambient air or some surface in contact with the enclosure. As a result, a temperature of the outer surface is rarely uniform and hot spots often exist adjacent to a heat source.

One disadvantage to using the enclosure as a heat removal path is that some areas of the enclosure can be quite warm to the touch and in some cases a surface temperature of the exterior of the enclosure can reach uncomfortable levels. Enclosure temperatures are particularly important in portable electronic devices such as laptop computers and tablet PC's where a user holds the device or rests the device on their lap or on an arm. The human body provides an efficient liquid cooled environment that tends to draw heat out of electronic enclosures. Although it is desirable to remove heat from a system housed in an enclosure by using the enclosure itself as a conductive path, it is also desirable to keep surface temperatures of the enclosure within comfortable levels for the user.

As an example of a prior heat removal approach 200, in FIG. 1a a heat source 205 that dissipates a substantial amount of heat h is positioned in contact with or in close proximity an interior surface 201i of a laptop computer enclosure 201. The heat source 205 can be a graphics chip, a North Bridge chip, or a microprocessor, for example; however, for the purposes of experimental verification, if FIG. 1a the heat source 205 is a series of surface mount resistors connected with a power source 207 for supplying a current i that can be varied w to adjust the amount of heat h generated by the source 205 (i.e. the power in Watts). A thermocouple 209 connected with the heat source 205 can be used to measure a temperature of the heat source 205 using a thermometer 211.

Typically, plastics including a Polycarbonate (PC) or a PC/ABS material are used for the enclosure 201 because plastic is a good electrical insulator, has a low weight compared to metals, and can be manufactured at a low cost. The enclosure 201 can also be made from a metal such as aluminum (Al), for example. Optionally, an air gap (not shown) between the interior surface 201i and the heat source 205 allows an airflow from a fan to cool the heat source 205 and to remove some of the heat h from the interior of the enclosure 201. However, some of the heat carried away by the air flow is thermally transferred to the interior surface 201i. Additionally, radiant heat from the heat source 205 is also transferred to the interior surface 201i. Consequently, the heat h is thermally transferred from the interior surface 201i to an exterior surface 201e of the laptop computer resulting in a high surface temperature (e.g. a hot spot) at the exterior surface 201e. A user of the laptop computer may feel discomfort when the exterior surface comes into contact with their body.

The above mentioned discomfort is due to the heat h being concentrated in a portion of the enclosure A that is adjacent to the heat source 205. Essentially, the heat h that is thermally transferred from the interior surface 201i to the exterior surface 201e does not evenly spread out over the entire exterior surface 201e. Instead, the heat is mostly concentrated in a hot spot A over the heat source 205 and that hot spot A is the cause of the discomfort to the user. One need only rest a prior laptop computer on a surface of a table, and after short period of time, move the laptop aside and feel that only a portion of the surface is warm to the touch because the heat from the hot spot A was concentrated over the warm portion of the surface of the table.

In many applications a thin layer of an electrically conductive material 203, such as a metal, for example will be bonded with the interior surface 201i to serve as an EMI shield. As an example, a steel stamping is often bonded with the plastic enclosure 201. In either case, the plastic and the steel have an equally bad thermal conductivity along all three axes (x-y axis, z-axis). Accordingly, at a point B on the exterior surface 201e, a temperature on the exterior surface 201e is substantially cooler than at the hot spot A because a majority of the heat h is thermally conducted into the z plane instead of the x-y plane.

As an example of a hot spot generated by the prior configuration of FIG. 1a, in FIG. 1b, with the heat source 205 generating about 2.0 W at a temperature of about 122.9° C. above an ambient temperature of about 25° C. Infrared thermal imagery of the exterior surface 201e depicts a temperature of about 97° C. at a hot spot A (see 251A) and a temperature of about 22.6° C. at a point B (see 251B), with a difference of 74.4° C. between the A and B temperatures. Most of the heat h is concentrated over the hot spot A as depicted by the heavy solid arrows, and to a lesser extent, some of the heat h spreads a short distance from the hot spot A as depicted by the dashed arrows. Consequently, the hot spot A can be a source of discomfort when the exterior surface 201e comes into contact with a users body.

As another example of a prior approach for reducing hot spots, in FIG. 1c a layer 221 of a thermally insulating material is bonded with the interior surface 201i and the heat source 205 is in contact with the insulating layer 221. The material for the layer 221 is a PTFE bound silica aerogel insulation material with a thickness of about 0.75 mm and including a very low thermal conductivity along all three axes (x-y, and z).

In FIG. 1d, at 2.0 W power dissipation from the heat source 205, even with an insulator 221 between the heat source 205 and the exterior surface 201e, the thermal image indicates a temperature of about 82.1° C. at a hot spot A (see 252A) and a temperature of about 25.3° C. at a point B (see 252B), with a difference of 56.8° C. between points A and B. Although, the temperature at the hot spot A is lower and the temperature differential is lower when the insulating layer 221 is used, the temperature of the heater 205 actually rises to about 134.4° C. above ambient temperature, an increase of 11.5° C. when compared to the 122.9° C. in the configuration of FIG. 1a where no insulation is used. Consequently, with a thermal insulating material, an actual operating temperature of the device the heater 205 simulates (e.g. a graphics chip or a North bridge chip) would get hotter which is not good for device reliability.

In FIG. 2a, a prior heat removal approach 200 can also include the addition of a heat spreader material 213 positioned between the enclosure 201 and the heat source 205. There may be an air gap (not shown) between the heat spreader 213 and the heat source 205. Although heat spreader materials can have high thermal conductivities in all three planes (x-y and z), the material selected for the heat spreader 213 has its highest thermal conductivity in the x-y plane and a more modest thermal conductivity in the z plane. The heat spreader 213 serves to thermally conduct heat h away from the heat source 205 and distribute a portion of the heat h along the enclosure 201 so that the temperature at the hot spot A is reduced. In FIG. 2b, with the heat source 205 dissipating 2.0 W, thermal imagery of the enclosure 201 with the heat spreader 213 depicts the hot spot A at about 41.9° C. (see 253A) and the point B at about 32.3° C. (see 253B), a difference of about 9.6° C. The heat source 205 was at a temperature of about 52.7° C. above ambient temperature. Although this is an improvement over the thermal images of FIGS. 1b and 1d, the hot spot A in FIG. 2b is still warmer than desired and may result in discomfort to a user.

Moreover, with the heater 205 set to a higher power dissipation of 5.0 W in FIG. 2c, the thermal image depicts the hot spot A at about 61.8° C. (see 255A) and the point B at about 44.5° C. (see 255B), a difference of about 23.6° C. The heat source 205 was at a temperature of about 131.4° C. above ambient temperature. Accordingly, the heat spreader 213 alone cannot reduce the temperature of the hot spot A to comfortable user levels. Furthermore, at the higher power levels (i.e. 5.0 W) that can be expected from components such as graphics chips and North bridge chips, the temperature of the heat source 205 above ambient temperature more than doubles and the hot spot A temperature increases by 26.2° C.

Consequently, there exists a need for a device for uniformly spreading heat transferred to a surface of an enclosure over a large region so that hot spot regions are reduced and user discomfort is reduced because the heat is uniformly distributed over the surface. There is also a need for a device for equalizing temperatures on a surface of an enclosure that does not increase a temperature of a heat source. Finally, there is a need for a device for equalizing temperatures on a surface of an enclosure that can reduce a temperature of a heat source while evenly distributing heat along a surface of the enclosure thereby reducing hot spots.

SUMMARY OF THE INVENTION

The device of present invention solves the aforementioned problems created by hot spot regions. The device includes a first layer with a high thermal conductivity along a first plane and one or more layers of material including a controlled thermal conductivity along a second plane that is normal to the first plane. One of the layers with the controlled thermal conductivity has a low thermal conductivity in the second plane and is positioned between the heat source and the enclosure so that waste heat from the heat source is substantially inhibited from being thermally conducted through the layer. As a result, a majority of the waste heat is thermally conducted through the first layer along the first plane. The first layer is in contact with the enclosure and the waste heat is evenly distributed over an exterior surface of the enclosure. Consequently, a hot spot over the heat source is eliminated or significantly reduced.

Alternatively, a plurality of layers of material with a controlled thermal conductivity along the second plane can be in contact with the enclosure and the first layer with one of the plurality of layers having the lowest of the controlled thermal conductivities so that waste heat transfer through that layer is significantly inhibited and a majority of the waste heat flows through the first layer along the first plane and is thermally transferred to the enclosure through the other layers of material with the controlled thermal conductivities. By providing a path of low thermal resistance to a large area of the exterior surface, heat transfer out of the device is enhanced, resulting in a lower operating temperature for the heat source.

Other aspects and advantages of the present invention will become apparent from the following detailed description, taken in conjunction with the accompanying drawings, illustrating by way of example the principles of the present invention.

BRIEF DESCRIPTION OF THE DRAWINGS

FIG. 1b depicts a thermal image of a hot spot generated by the prior heat removal device of FIG. 1a.

FIGS. 2b and 2c depict thermal images of a hot spot generated by the prior heat removal device of FIG. 2a.

FIGS. 3a and 3b are cross-sectional views depicting a device with a controlled Z-axis conductivity.

FIG. 3c depicts a first plane and a second plane relative to a Cartesian coordinate system.

FIG. 5 is a profile view depicting a heat flow that is predominantly in a first plane defined by a X-axis and a Y-axis.

FIGS. 5a and 5b are cross-sectional views of a device with a controlled Z-axis conductivity.

FIGS. 7a and 7b are cross-sectional views of a device with a controlled Z-axis conductivity.

FIGS. 9a and 9b are a cross-sectional views depicting a device with a controlled Z-axis conductivity.

DETAILED DESCRIPTION

Figure 1A:
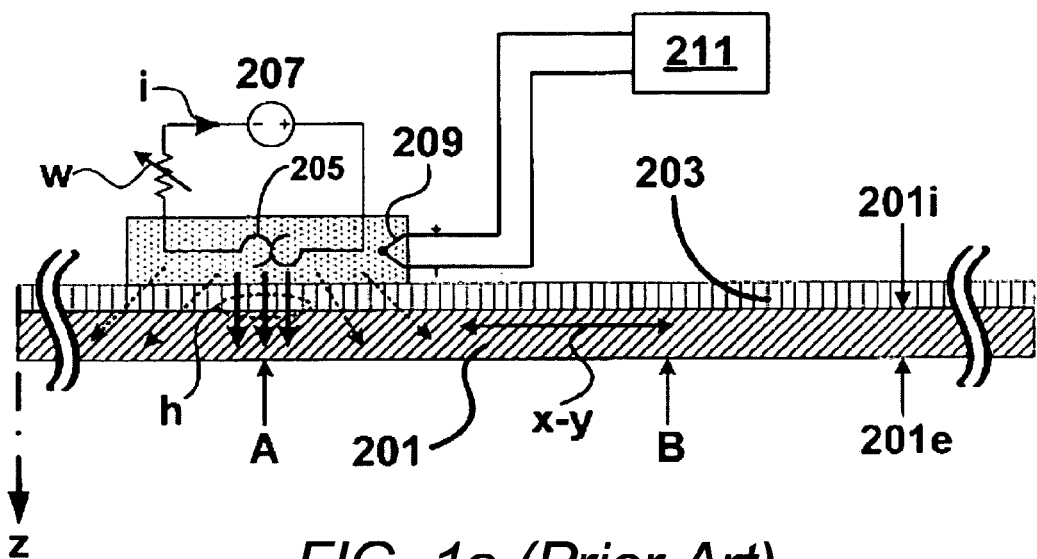
FIG. 1a is a cross-sectional view depicting a prior heat removal device.
Figure 1B:
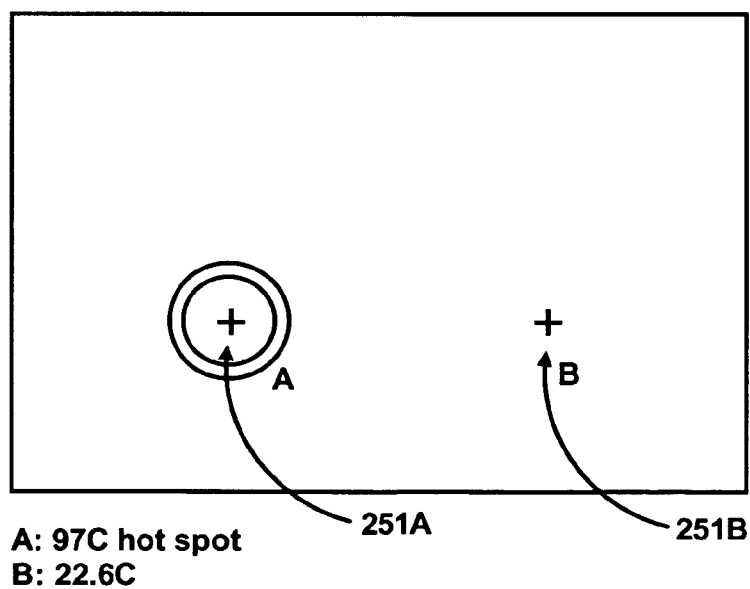
Figure 1C:
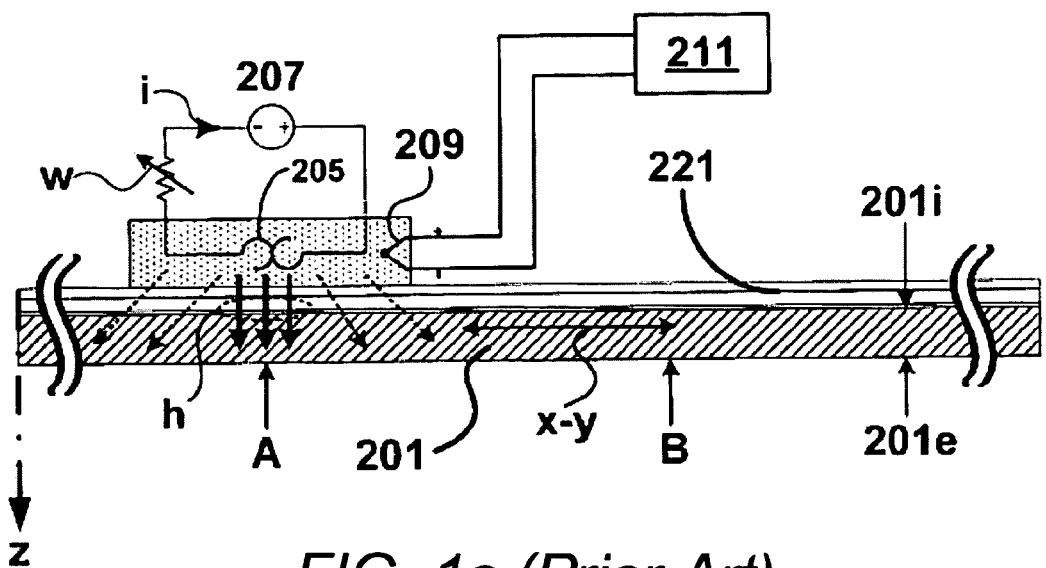
FIG. 1c is a cross-sectional view depicting another prior heat removal device.
Figure 1D:
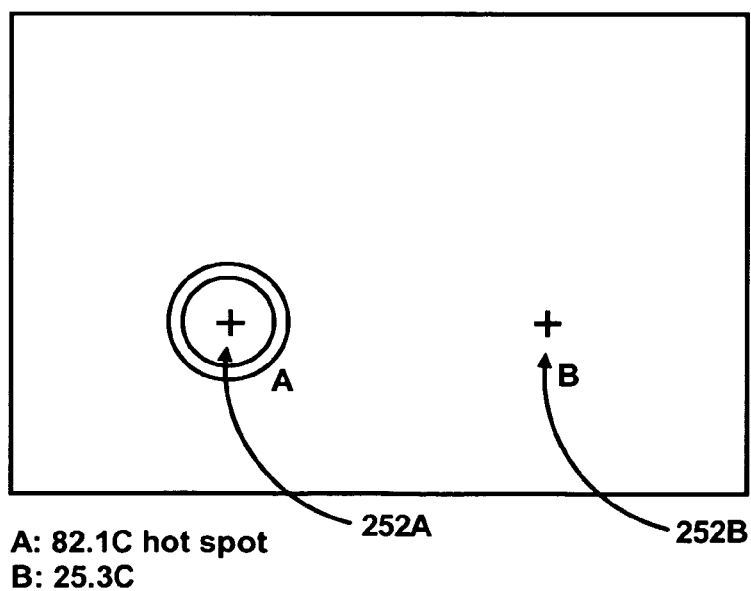
FIG. 1d depicts a thermal image of a hot spot generated by the prior heat removal device of FIG. 1c.

In the following detailed description and in the several figures of the drawings, like elements are identified with like reference numerals.

As shown in the drawings for purpose of illustration, the present invention is embodied in a device for uniformly distributing waste heat from a heat source to an enclosure. In FIG. 3a, a device 10 for uniformly distributing waste heat H from a heat source 20 to an enclosure 30 includes a first layer 11 that includes a first thermal conductivity along a first plane. For purposes of illustration only, in FIG. 3c, a Cartesian coordinate system depicts the first plane X-Y as lying on a X-axis and a Y-axis (see $P_1$) and a second plane $P_2$ as lying on a Z-X axis and a Z-Y axis. Consequently, the first and second planes ($P_1$, $P_2$) are orthogonal to one another. In that the first plane $P_1$ is defined by the X-axis and the Y-axis and the second plane $P_2$ is defined by the Z-X and the Z-Y axes, hereinafter, the first plane will be denoted as X-Y and the second plane will be denoted as Z.

The first layer 11 is in thermal communication with the heat source 20 and with the enclosure 30. In FIG. 3a, the first layer 11 is in contact with an interior surface 31i of the enclosure 30 and the first plane X-Y is substantially parallel to a surface of the enclosure 30. Preferably, the first plane X-Y is substantially parallel to the interior surface 31i.

A second layer 13 includes a second thermal conductivity Z1 along the second plane Z that is substantially normal to a surface of the enclosure 30, preferably substantially normal to the interior surface 31i. The second layer 13 is in contact with the enclosure 30 and the first layer 11. The second layer 13 is positioned in facing relation to the heat source 20 and a portion of the first layer 11 is positioned between the heat source 20 and the second layer 13. The second thermal conductivity Z1 of the second layer 13 is substantially lower than the first thermal conductivity of first layer 11. Essentially, the first layer 11 acts as a heat spreader that thermally conducts heat in the first plane X-Y; whereas, the second layer 13 acts as a thermal insulator that substantially inhibits heat transfer in the second plane Z. Accordingly, in FIG. 3a, waste heat H transfer through the second layer 13 to the enclosure 30 is substantially inhibited by the low second conductivity Z1 and a majority of the waste heat H is thermally transferred through the first layer 11 along the first plane X-Y as depicted by the dashed arrow. The waste heat H is then thermally conducted into the enclosure 30.

Because the second layer 13 inhibits heat transfer in the second plane Z only a small portion of the waste heat reaches a point A on the exterior surface 31e and a temperature at the point A is lower than would be the case if the first layer 11 were used exclusively to manage heat transfer from the heat source 20 to the enclosure 30.

Moreover, because of the higher first thermal conductivity of the first layer 11 along the first plane X-Y, a heat transfer $H_T$ to the exterior surface 31e of the enclosure 30 at a point B is uniformly distributed over the exterior surface 31e and a temperature of the exterior surface 31e at the point B is also lower than would be the case if the first layer 11 were used exclusively to manage heat transfer from the heat source 20 to the enclosure 30.

In FIGS. 3a and 3b, an EMI shield 23 may optionally be included. The EMI shield 23 can be connected with the enclosure 30 and the first and second layers (11, 13) as depicted in FIG. 3a or the EMI shield 23 can be connected with the heat source 30 and the first layer 11 as depicted in FIG. 3b. The EMI shield 23 can be made from an electrically conductive material, such a steel, for example.

In FIGS. 3a and 3b, the first layer 11 and the second layer 13 can be connected with each other using a variety of methods including but not limited to laminating the first and second layers (11, 13) to each other, using a glue or an adhesive to connect the first and second layers (11, 13) with each other, forming a depression in the first layer 11 and then positioning the second layer 13 in the depression, just to name a few. An adhesive or a glue can be used to connect the first and second layers (11, 13) with the enclosure 30 or the EMI shield 23. Alternatively, if the first layer 11 is made from an electrically conductive material, then the first layer 11 can be electrically connected to a ground potential (see FIG. 5) so that the first layer 11 can serve as an EMI shield.

Similarly, the thermal communication between the heat source 20 and the first layer 11 can be a direct contact between the heat source 20 and the first layer 11 (see FIGS. 3a and 3b), by a gap G between the heat source 20 and the first layer 11 (see FIG. 5a), or by a layer of a thermal interface material 29 (see FIG. 5a) that is in contact with the heat source 20 and the first layer 11. If thermal communication is through the gap G, then some of the waste heat H transferred to the first layer 11 can be via radiant heat from the heat source 20. Additionally, if a fan or the like is used to convection cool the heat source 20, then heated air entrapped in the gap G will also thermally transfer some of the waste heat H to the first layer 11.

Figure 4A:
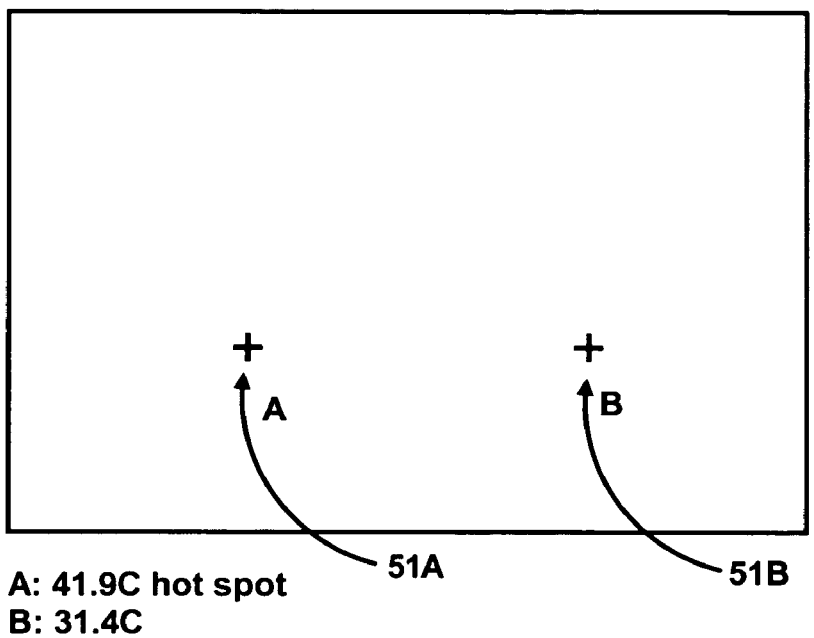
FIGS. 4a and 4b depict thermal images of a temperature profile of an exterior of an enclosure in thermal communication with a device with a controlled Z-axis conductivity as depicted in FIGS. 3a and 3b.

In FIG. 4a, an efficacy of the device 10 at reducing hot spots and at evenly distributing the waste heat H over the exterior surface 31e of the enclosure 30 is depicted in an infrared thermal image. In FIG. 5, the heat source 20 is simulated using a heater 90 connected with an adjustable W power source 91 for supplying a current i to the heater 90. The points A and B in FIG. 5 are denoted as 51A and 51B in FIG. 4a. A thermocouple 93 is connected with a thermometer 95 for measuring a temperature of the heat source 20.

With the heater 90 set to dissipate about 2.0 W with the heat source 20 at about 51.8° C. above an ambient temperature of about 25° C. On the exterior surface 31e, at the point 51A a temperature of about 41.9° C. is recorded in the infrared thermal image and at the point 51B the temperature is about 31.4° C. for a temperature differential of 10.5° C. (i.e. 41.9° C.−31.4° C.=10.5° C.).

Figure 2A:
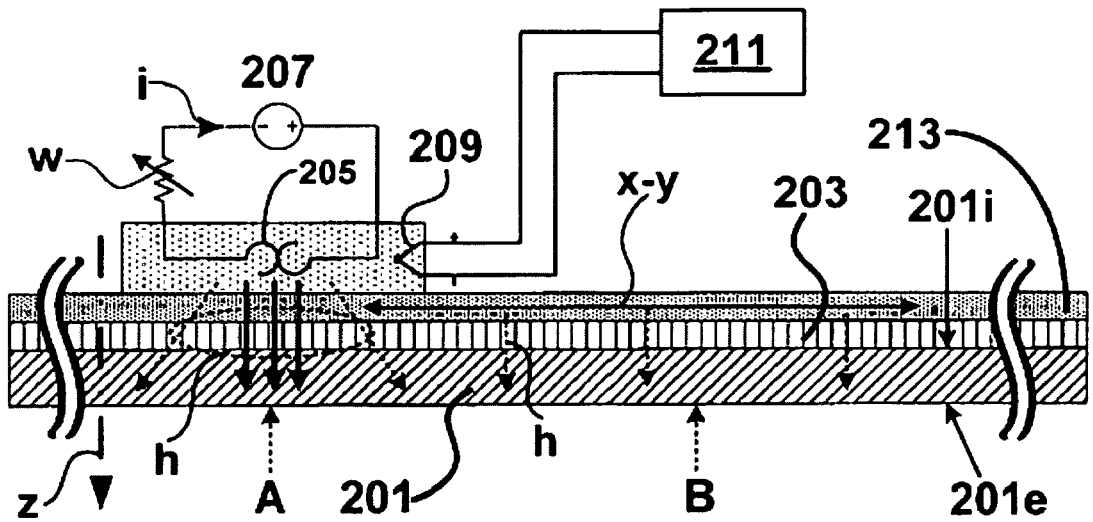
FIG. 2a is a cross-sectional view depicting of yet another prior heat removal device.
Figure 2B:
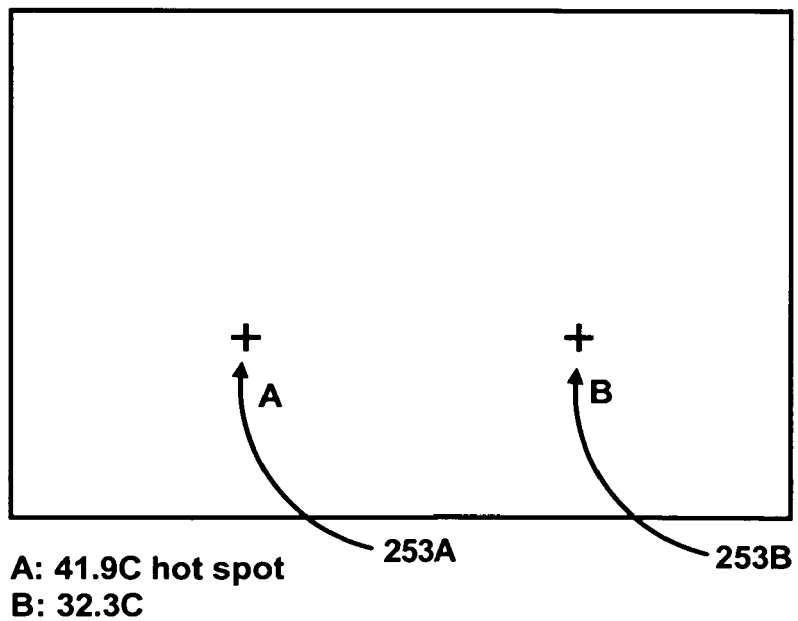
Figure 2C:
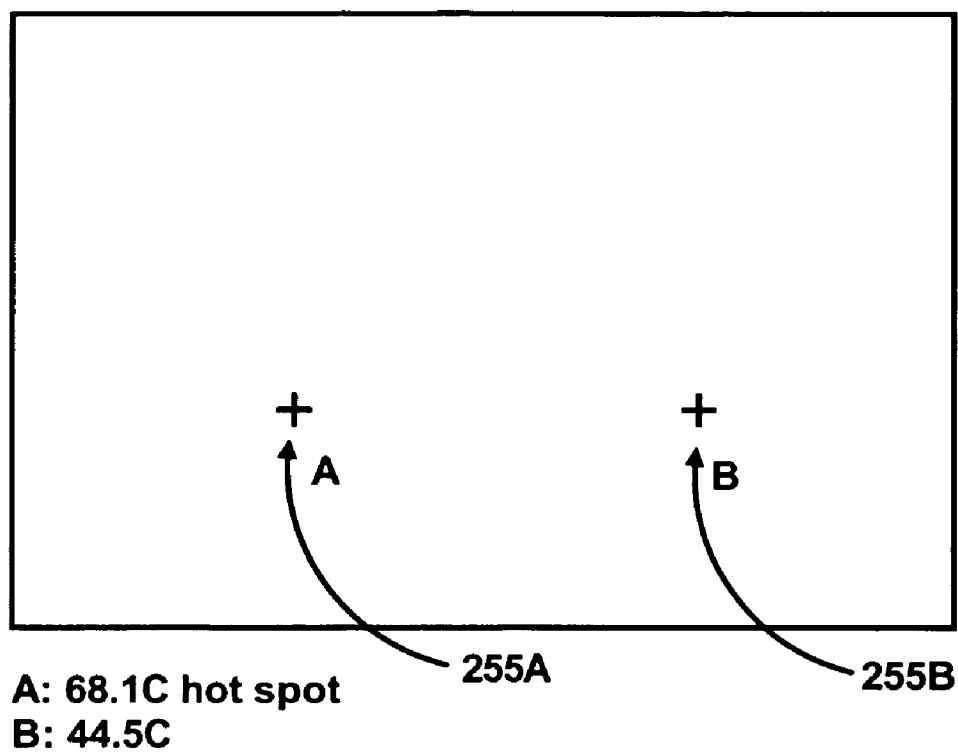

In contrast to the prior configuration depicted in FIGS. 2a and 2b in which only the heat spreader 213 is used, the configuration of FIG. 5 results in the temperature at the point 51A being 40.2° C. lower (i.e. 82.1° C.−41.9° C.=40.2° C.); whereas, the temperature at the point 51B is slightly higher at 6.1° C. (i.e. 31.4° C.−25.3° C.=6.1° C.). However, the temperature differential between points 51A and 51B of FIG. 4a is substantially lower at 10.5° C. versus a temperature differential of 56.8° C. in prior FIG. 2b. As a result, the heat $H_T$ transferred to the exterior surface 31e is more evenly distributed over the exterior surface 31e and is not as concentrated over the point 51A, unlike the point 253A in the prior configuration depicted in FIGS. 2a and 2b.

Figure 4B:
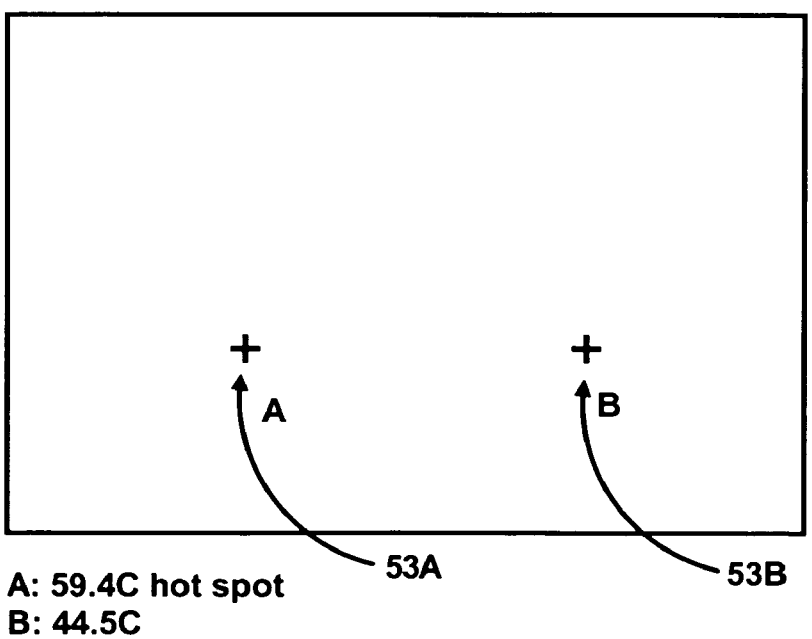

In FIG. 4b, the power dissipation from the heater 90 was set to dissipate about 5.0 W with the heat source 20 at about 130.1° C. above ambient temperature. The points A and B in FIG. 5 are denoted as 53A and 53B in FIG. 4b. On the exterior surface 31e, at a point 53A a temperature of about 59.4° C. is recorded in the infrared thermal image and at a point 53B the temperature is about 44.5° C. for a temperature differential of 14.9° C. (i.e. 59.4° C.−44.5° C.=14.9°

C.). Therefore, even when the power dissipation from the heater 90 is more than doubled (i.e. increased by 2.5 times), the temperature of 59.4° C. at the point 53A is still significantly less than the temperature of 82.1° C. at the prior point 253A of FIG. 2b. Even though the temperature of 44.5° C. at the point 53B is higher than the temperature of 25.3° C. at the prior point 253B, given that the power has been increased to 5.0 W in FIG. 4b versus the 2.0 W in FIG. 2b, the temperature increase at the point 53B is reasonable and the heat $H_T$ transferred to the exterior surface 31e is nonetheless more evenly distributed over the exterior surface 31e and is not as concentrated over the point 53A, unlike the point 253A in the prior configuration depicted in FIGS. 2a and 2b.

The effectiveness of combining the first layer 11 which acts as a head spreading layer in the first plane X-Y with the second layer 13 which inhibits thermal transfer in the second plane Z can be seen in the infrared thermal images in FIGS. 4a and 4b. The temperature differential between the points 51A and 53A is only 17.5° C. and the temperature differential between the points 51B and 53b is only 13.1° C. Accordingly, as the power is increased by 2.5 times, the resulting temperature differentials are not significantly increased and the heat $H_T$ transferred to the exterior surface 31e is more uniformly distributed even though the exterior surface 31e is warmer at the higher power output.

In FIGS. 5a and 5b, alternative configurations of layers with a controlled Z-axis thermal conductivities include adding a third layer 14 with a third thermal conductivity Z2 along the second plane Z. The third thermal conductivity Z2 can be less than or equal to the second thermal conductivity Z1 of the second layer 13 (Z2≦Z1). The third layer 14 is in contact with the first layer 11 and the second layer 13 and is positioned between the heat source 20 and the enclosure 30. The third layer 14 can be used to further inhibit heat transfer through the second layer 13 to the enclosure 30. Essentially, a thermal resistance is increased by adding the third layer 14 and the first layer 11 becomes a lower resistance path for the waste heat H to reach the exterior surface 31e. In FIG. 5a, the third layer 14 is positioned on a surface 13s of the second layer 13. In FIG. 5b, the third layer 14 is inset in the second layer 13. A surface of the third layer 14 can be flush with a surface of the second layer 13 as depicted in FIG. 5b or the surface of the third layer 14 can extend outward (not shown) of or be recessed below (not shown) the surface of the second layer 13.

Figure 6A:
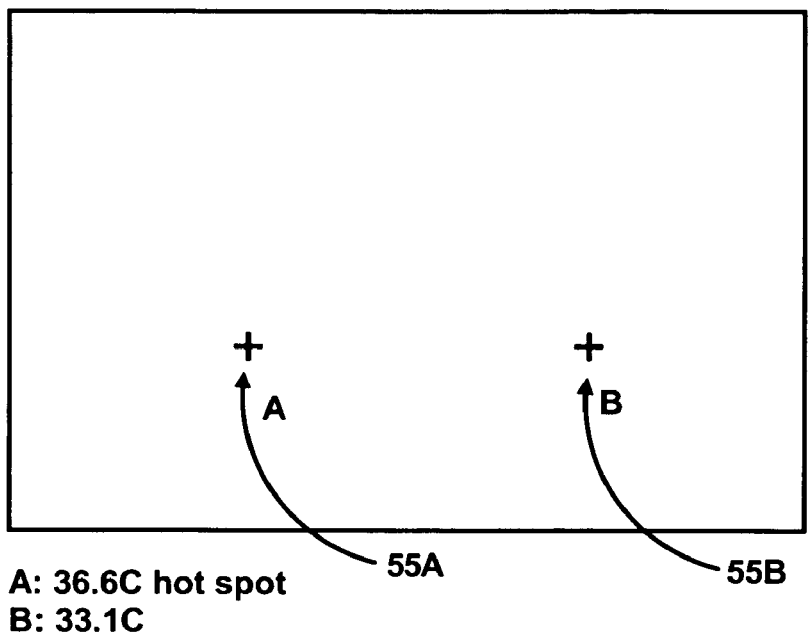
FIGS. 6a and 6b depict thermal images of a temperature profile of an exterior of an enclosure in thermal communication with the heat spreader with controlled Z-axis conductivity as depicted in FIGS. 5a and 5b.
Figure 6B:
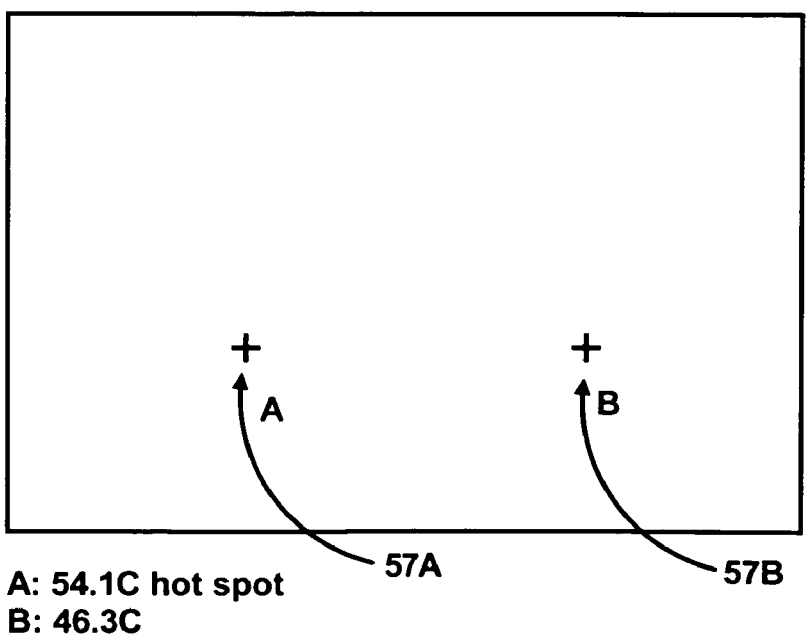

In FIGS. 6a and 6b, the configuration including the third layer 14 as depicted in FIG. 5a was thermally imaged at 2.0 W and 5.0 W respectively. At points 55A and 55B of FIG. 6a, the temperatures at the exterior surface 31e are 36.6° C. and 33.1° C. respectively, with a temperature differential of 3.5° C. In comparison, in FIG. 4a, at the point 51A the temperature was 41.9° C. (5.3° C. hotter than at 55A) and the temperature at the point 51B was 31.4° C. (1.7° C. cooler than at 55B); however, the temperature differential of 13.5° C. in FIG. 4a is 10.0° C. higher than the temperature differential of 3.5° C. in FIG. 6a.

Therefore, the addition of an additional layer of material (i.e. the third layer 14) with the third thermal conductivity Z2 in the second plane Z results in an even lower exterior surface 31e temperature at the hot spot point A over the heat source 20 and also results in a more even temperature profile over the exterior surface 31e (i.e. a 3.5° C. difference between points 55A and 55B).

Similarly, in FIG. 6b, at 5.0 W of power dissipation, the temperatures at the exterior surface 31e at points 57A and 57B, are 54.1° C. and 46.3° C. respectively, with a temperature differential of 7.8° C. In contrast, in FIG. 4b, at the point 53A the temperature was 59.4° C. (5.3° C. hotter than at 57A) and the temperature at the point 53B was 44.5° C. (1.8° C. cooler than at 57B); however, the temperature differential of 14.9° C. in FIG. 4b is 7.1° C. higher than the temperature differential of 7.8° C. in FIG. 6b. As before, the third layer 14 acting in conjunction with the second layer 13 results in an even lower exterior surface 31e temperature at the hot spot point A over the heat source 20 and also results in a more even temperature profile over the exterior surface 31e.

Although the second layer 13 as depicted in FIGS. 3a, 3b, 5a, and 5b is positioned between the heat source 20 and the enclosure 30, the layer 13 need not have its entire length localized over the heat source 20. The layer 13 can have a length that spans the entire length of the layer 11 or spans an entire length of an interior surface 31i of the enclosure 30 as depicted in FIG. 5a.

In FIGS. 7a and 7b, the device 10 can include the aforementioned first layer 11 in thermal communication with the heat source 20 and including the first thermal conductivity in the first plane X-Y. However, a plurality of layers of material (13, 15,16) are in contact with the first layer 11 and the enclosure 30 and those layers of material include a controlled thermal conductivity along the second plane Z. A selected one of the plurality of layers of material (i.e. 13) includes a controlled thermal conductivity in the second plane Z that is lower than all of the other plurality of layers. A portion of the first layer 11 is positioned between the heat source and the layer 13. Essentially, the layer 13 is made from a material with a low thermal conductivity in the Z-axis and the layers (15, 16) are also made from a material with a low thermal conductivity in the Z-axis; however, the layer 13 is a better thermal insulator than the layers (15, 16). Consequently, waste heat H transfer through the layer 13 to the enclosure 30 is substantially inhibited and a majority of the waste heat H is thermally transferred through the first layer 11 along the first plane X-Y and is thermally transferred through the plurality of layers 15 and uniformly distributed on the exterior surface 31e of the enclosure 30.

In FIG. 7a, the layers (15, 16) can have thermal conductivities Z2 and Z3 along the second plane Z that are the same (Z2=Z3) or different (Z2≠Z3). As an example, if Z2 and Z3 are the same, then heat transfer to points B and C on the exterior surface 31e can be substantially equal so that the waste heat H from the heat source 20 does not create a hot spot at the point A and the heat $H_T$ is evenly distributed on the exterior surface 31e.

On the other hand, it may be desirable to reduce the hot spot temperature at the point A while still evenly distributing the heat $H_T$ on the exterior surface 31e. However, it may also be desirable to contour the heat profile on the exterior surface 31e by having the layer 15 with the thermal conductivity Z2 have a lower thermal conductivity than the layer 16 with the thermal conductivity Z3 such that the surface temperature at the point C will be higher than the surface temperature at the point B, but overall the temperature profile over the exterior surface 31e is not so hot as to cause discomfort to a user.

In FIG. 7b, the layer 15 is positioned on one side of the layer 13 so that heat transfer through the first layer 11 is channeled to the point B. The configuration depicted in FIG. 7b can be used to control where on the exterior surface 31e the heat H from the heat source 20 will be evenly distributed.

In FIGS. 7a and 7b, the layers (13,15, and 16) may be connected with one another as depicted (i.e. connected at an edge portion of the layers) or one or more of the layer (13, 15, and 16) can be spaced apart from an adjacent layer so that there is a gap G between the adjacent layers as depicted in FIG. 7a between the layers 13 and 16. The device 10 can also include an EMI shield as described above in reference to FIGS. 3a and 3b or the first layer 11 can be connected to a ground potential.

Figure 8A:
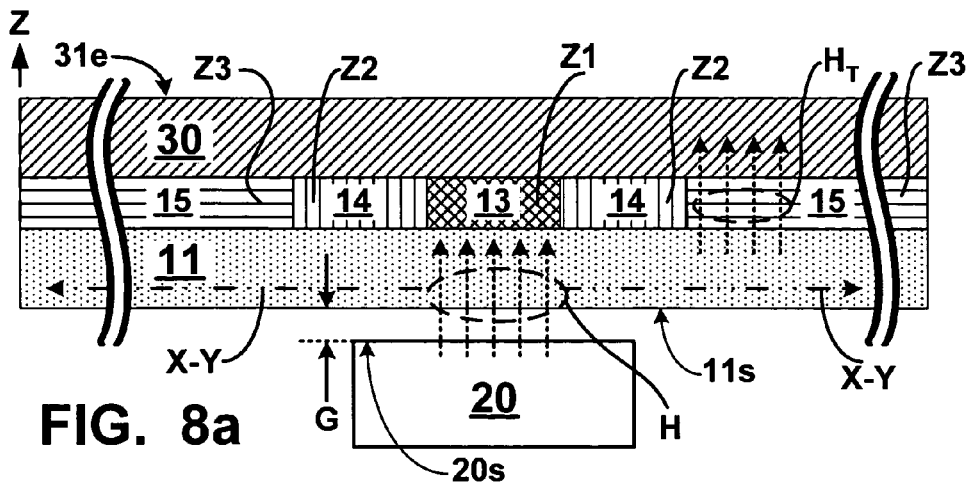
FIGS. 8a and 8b are a cross-sectional view and a top plan view respectively of a device with a controlled Z-axis conductivity.
Figure 8B:
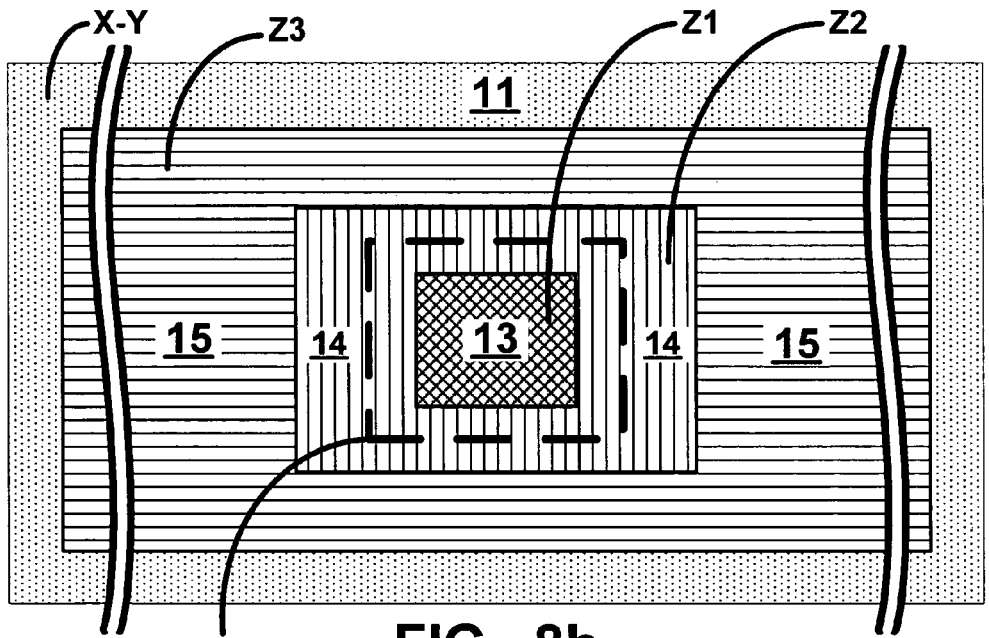

In FIGS. 8a and 8b, the plurality of layers includes layers (13, 14, and 15) and the layer 13 has the lowest thermal conductivity Z1 followed by the layer 14 which has a slightly higher thermal conductivity Z2. The thermal conductivities Z3 of the layers 15 are higher to facilitate heat transfer $H_T$ to the exterior surface 31e.

In FIG. 8b, the layers (11, 13, 14, and 15) can be laminated, glued, or otherwise connected to one another. For example one or more of the layers (11, 13, 14, and 15) can include a single or double-sided adhesive backing to allow that layer to be adhesively connected with other layers. The layer 14 can have an opening formed therein and adapted to receive the layer 13. For example, the layer 14 can be die cut to fit the layer 13 in the opening.

Figure 8C:
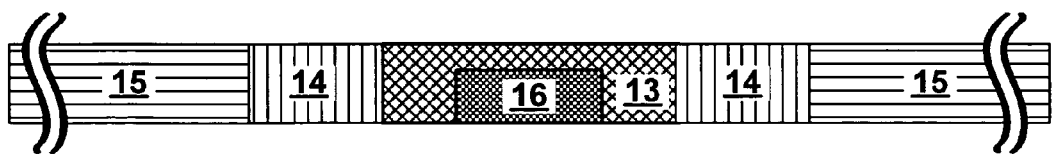
FIGS. 8c and 8d are cross-sectional views of a device with a controlled Z-axis conductivity.
Figure 8D:
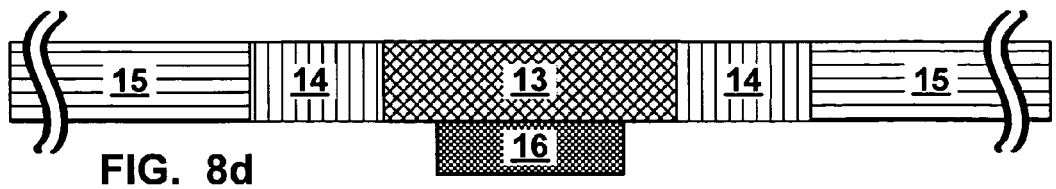

In FIGS. 8c and 8d, the third layer as mentioned above in reference to FIGS. 5a and 5b can be used with the plurality of layers (13, 14, and 15). For example, a third layer 16 can be inset in the layer 13 as depicted in FIG. 8c or the layer 16 can be positioned on a surface of the layer 13 as depicted in FIG. 8d.

In FIGS. 9a and 9b, the device 10 includes the first layer 11 in thermal communication with the heat source 20; however, the plurality of layers of material are in contact with the external surface 31e of the enclosure 30. A selected one of the plurality of layers of material (i.e. the layer 13) has a lowest of the controlled thermal conductivities along the second plane Z and the first layer 11 and the enclosure 30 are positioned between the layer 13 and the heat source 20. As described above, waste heat H transfer through the layer 13 is substantially inhibited and a majority of the waste heat H is thermally transferred through the layer 11 and the enclosure 30 where the controlled thermal conductivities (Z1, Z2, Z3, Z4) of the plurality of layers (13, 14, 15, 17) uniformly distribute the waste heat on a surface formed by the plurality of layers (13, 14, 15, 17). Optionally, the device 10 can include a cover layer 27 in contact with the plurality of layers of material (13, 14, 15, 17). The cover layer 27 can serve as an outer surface and can also protect the plurality of layers of material (13,.14,15,17) from damage. The cover layer 27 can be connected with the plurality of layers (13, 14, 15, 17) by a glue or an adhesive, for example. Additionally, the outer cover 27 can be made from an anti-skid material that prevents the enclosure from sliding on a surface it rests upon.

Figure 10A:
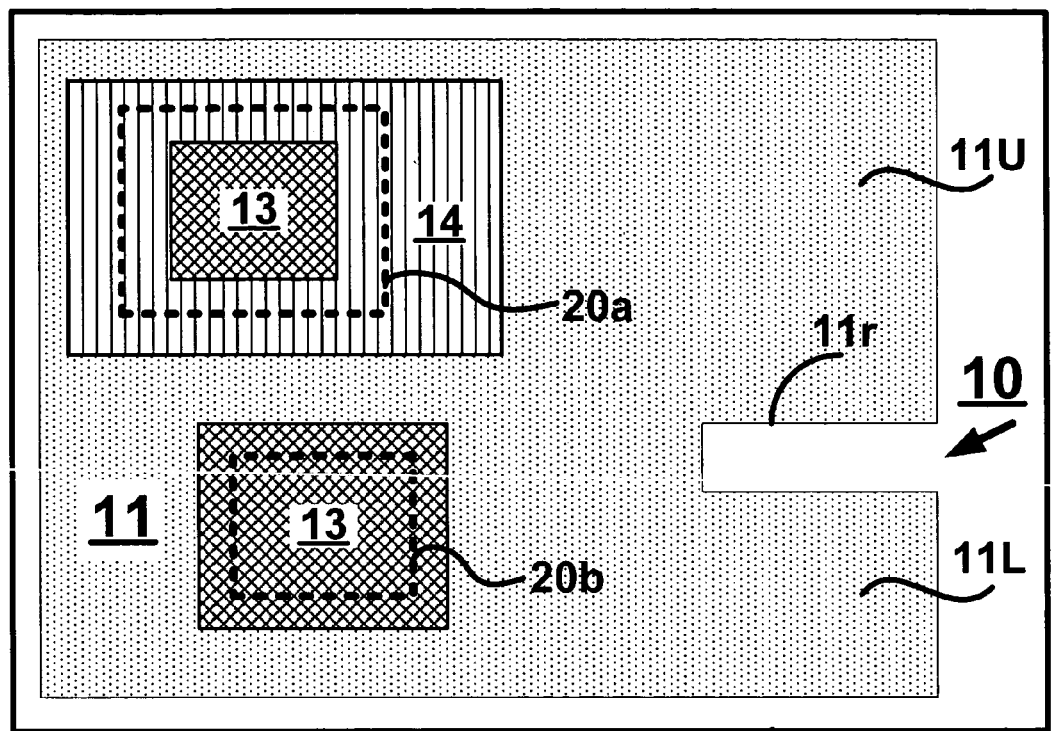
FIG. 10a is a top plan view depicting a plurality of heat sources in thermal communication with a device with a controlled Z-axis conductivity.
Figure 10B:
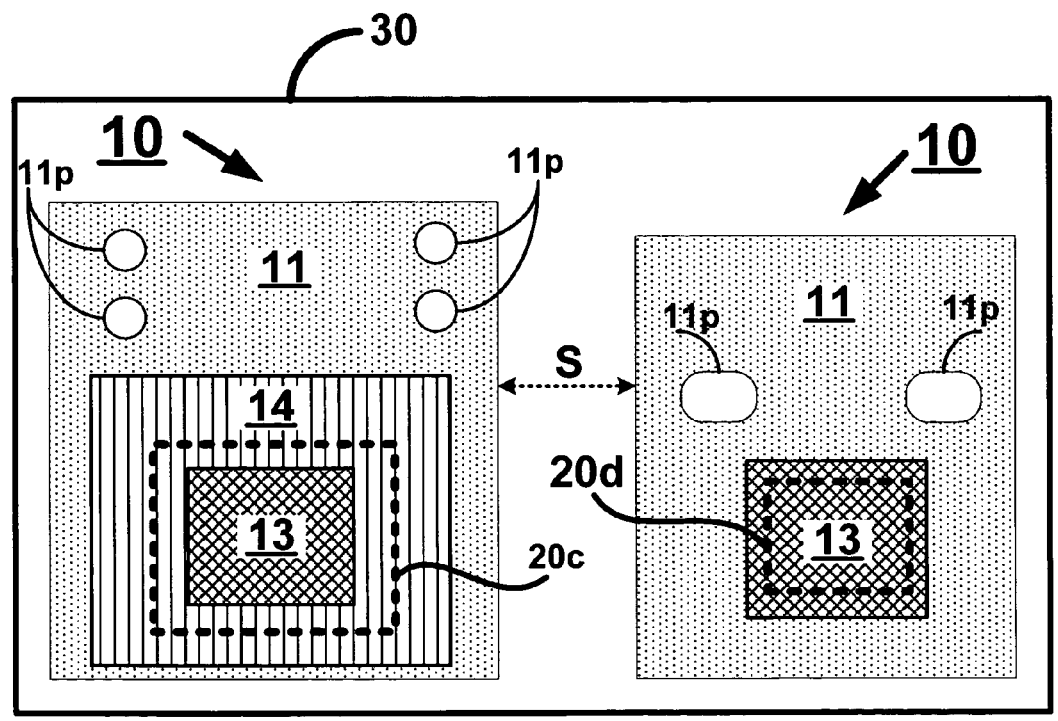
FIG. 10b is a top plan view depicting a plurality of devices with a controlled Z-axis conductivity in an enclosure.

Although only one heat source 20 has been depicted herein as being in thermal communication with the layer 11 of the device 10, the present invention is not limited to only one heat source 20 and one or more heat sources 20 can be in thermal communication with the layer 11 as depicted by heat source 20a and 20b (shown in dashed outline) on the layer 11 in FIG. 10a. The layers of controlled Z-axis conductivity material can be different for the heat sources (20a, 20b) to address the application specific requirements for thermal management and user comfort. Moreover, two or more of the devices 10 can be connected with the enclosure 30 as depicted in FIG. 10b where layers 11 are in the same enclosure 30 be are separate S from each other.

The layers of material (11, 13, 14, 15, 16, 17) can be any shape and are not limited to the rectangular or square shapes depicted herein. For example, the layers may be irregularly shaped to conform to a shape of an enclosure 30 that is not square or rectangular. To modify the heat transfer characteristics of the device 10, one or more of the layers can include perforations (e.g. a hole) where material has been removed from that layer to alter its thermal characteristics.

The first layer 11 can be made from a material including but not limited to a thermally conductive metal, such as copper (Cu) or aluminum (Al), a thermal heat spreader material, and a thermal heat spreader material comprising graphite. For example, an exemplary material for the first layer 11 is a GrafTech® eGRAF™ thermal heat spreader material. The eGRAF™ graphite products are manufactured to have a high in-plane thermal conductivity along the first plane X-Y and a low thermal conductivity out-of-plane along the second plane Z. The flake like raw graphite used to produce GrafTech® products is roll bonded during manufacturing. The roll bonding process results in overlapping layers of aligned flakes. Since the flakes are better thermal conductors than the material that binds them, the thermal conductivity of the completed material is better along an axis aligned with a long axis of the flakes. In general, graphite heat spreader products, including the GrafTech® products, are manufactured to make the graphite materials selectively thermally conductive along specific planes (e.g. the first plane X-Y). As an example, a sheet of GrafTech® eGRAF™ 1240 or a sheet GrafTech® GS140-30a material can be used for the layer 11. Those GrafTech® heat spreader products are designed to have a higher thermal conductivity along the first plane X-Y and a low thermal conductivity in the second plane Z. The sheets for the layer 11 can very thin and can have a thickness of about 0.040 inches.

The layers 13, 14, 15, 16, and 17 can be made from a material including but not limited to a thermal insulating material and a thermal insulating material comprising an aerogel or a silica aerogel. As an example, a PTFE bound silica aerogel insulation material with a thickness of about 0.75 mm can be used for those layers. Silica aerogel materials have a very low thermal conductivity in all three axes; therefore, an aerogel makes a very effective thermal insulation material. When the plurality of layers are used, each layer can be selected to have a different value of thermal conductivity in the second plane Z with some of the layers being more effective thermal insulators than other layers.

Where the layers are not coplanar with one another, the first layer 11 can be conformally connected with the other layers as depicted by arrows 11c in FIGS. 3a and 3b where the first layer 11 conformally covers the second layer 13. The layers may not be perfectly conformal to one another other and is some instances there may be air gaps between adjacent layers. Although a laminating process is a logical choice for connecting the layers with one another, other processes such as depositing, spraying, molding, printing, and embedding can be used and the actual process used will be application specific. The enclosure 30 can be an enclosure for any device in which it is desirable to evenly distribute waste heat and to control thermal dissipation from one or more heat sources within the enclosure 30. For example, the enclosure 30 can be an enclosure for a laptop PC, a tablet PC, or a portable electronic device.

The layers depicted herein may or may not be continuous layers of material and one or more layers can have material removed from a portion of the layer. For example, in FIG. 10a, the layer 11 includes a portion 11r in which some of the material has been intentionally removed. The portion 11r can used to make space for some object positioned in the enclosure 30 (e.g. a component on a PC board) or the portion 11r can be used to modify the thermal conductivity of a layer. For example, the portion 11r can be positioned on the layer 11 so that a disproportionate amount of the waste heat H is spread to an upper portion 11U of the layer 11 as opposed to a lower portion 11L. For instance, this may be done if it is desired for a portion of the enclosure 30 that is adjacent to the lower portion 11L to be cooler than the a portion of the enclosure 30 that is adjacent to the upper portion 11U. Similarly, in FIG. 10b, the layers can include perforations 11p (i.e. a through hole) to accommodate PC board hardware, connectors, components, etc. The perforations 11p can have any shape and need not be circles or ovals as depicted. Although the layer 11 is depicted, any of the above mentioned layers can include the perforations 11p. The perforations 11p can also be used to modify the thermal conductivity of the layer the perforations are made in.

Although several embodiments of the present invention have been disclosed and illustrated, the invention is not limited to the specific forms or arrangements of parts so described and illustrated. The invention is only limited by the claims.

What is claimed is:

1. A device for uniformly distributing waste heat from a heat source to an enclosure, comprising:
   a first layer including a first thermal conductivity along a first plane substantially parallel to a surface of the enclosure, the first layer is in thermal communication with the heat source and the enclosure; and
   a second layer including a second thermal conductivity along a second plane substantially normal to the surface, the second layer is in contact with the enclosure and the first layer with a portion of the first layer positioned between the heat source and the second layer, and the second thermal conductivity is substantially lower than the first thermal conductivity so that waste heat thermally transfer through the second layer to the enclosure is substantially inhibited and a majority of the waste heat is thermally transferred through the first layer along the first plane and is uniformly distributed on an exterior surface of the enclosure; and
   a third layer including a third thermal conductivity along the second plane and the third thermal conductivity is less than or equal to the second thermal conductivity, the third layer is in contact with the first layer and the second layer and the third layer is positioned between the heat source and the enclosure, and wherein the third layer is operative to further inhibit waste heat transfer through the second layer to the enclosure.

2. The device as set forth in claim 1, wherein the first layer is made from a material including a high thermal conductivity in the first plane and the material is selected from the group consisting of a thermal heat spreader material, a thermal heat spreader material comprising graphite, and a thermally conductive metal.

3. The device as set forth in claim 1, wherein the second layer is made from a material including a low thermal conductivity in the second plane and the material is selected from the group consisting of a thermal insulating material, a thermal insulating material comprising an aerogel, and a thermal insulating material comprising a silica aerogel.

4. The device as set forth in claim 1 and further comprising an EMI shield and the EMI shield is connected with a selected one of the enclosure and the first and second layers or the heat source and the first layer.

5. The device as set forth in claim 1, wherein the thermal communication between the heat source and the first layer is through a selected one of a gap between the heat source and the first layer, a contact of the heat source with the first layer, or a layer of a thermal interface material in contact with the heat source and the first layer.

6. The device as set forth in claim 1, wherein the third layer is positioned on a surface of the second layer.

7. The device as set forth in claim 1, wherein the third layer is inset in the second layer.

8. The device as set forth in claim 1, wherein the third layer is made from a material including a low thermal conductivity in the second plane and the material is selected from the group consisting of a thermal insulating material, a thermal insulating material comprising an aerogel, and a thermal insulating material comprising a silica aerogel.

9. The device as set forth in claim 1, wherein the third layer includes a portion in which a material of the third layer has been removed.

10. The device as set forth in claim 1, wherein the first layer is electrically connected to a ground potential.

11. The device as set forth in claim 1, wherein the first layer includes a portion in which a material of the first layer has been removed.

12. The device as set forth in claim 1, wherein the second layer includes a portion in which a material of the second layer has been removed.

13. The device as set forth in claim 1, wherein the first layer includes a portion in which a material of the first layer has been removed.

14. A device for uniformly distributing waste heat from a heat source to an enclosure, comprising:
   a first layer including a first thermal conductivity along a first plane substantially parallel to a surface of the enclosure, the first layer is in thermal communication with the heat source; and
   a plurality of layers of materials in contact with the first layer and the enclosure, the plurality of layers including a controlled thermal conductivity along a second plane substantially normal to the surface;
   a selected one of the plurality of layers includes a lowest of the controlled thermal conductivities and a portion of the first layer is positioned between the heat source and the selected one of the plurality of layers, and wherein waste heat transfer through the selected one of the plurality of layers to the enclosure is substantially inhibited and a majority of the waste heat is thermally transferred through the first layer along the first plane where the controlled thermal conductivities of the plurality of layers uniformly distribute the waste heat on an exterior surface of the; and
   wherein a selected one or more of the plurality of layers is made from a material including a low thermal conductivity in the second plane and the material is selected from the group consisting of a thermal insulating material, a thermal insulating material comprising an aerogel, and a thermal insulating material comprising a silica aerogel.

15. The device as set forth in claim 14, wherein the first layer is made from a material including a high thermal conductivity in the first plane and the material is selected from the group consisting of a thermal heat spreader material, a thermal heat spreader material comprising graphite, and a thermally conductive metal.

16. The device as set forth in claim 14 and further comprising an EMI shield and the EMI shield is connected with a selected one of the enclosure and the plurality of layers or the heat source and the first layer.

17. The device as set forth in claim 14, wherein the thermal communication between the heat source and the first layer is through a selected one of a gap between the heat source and the first layer, a contact of the heat source with the first layer, or a layer of a thermal interface material in contact with the heat source and the first layer.

18. The device as set forth in claim 14, wherein the plurality of layers are in contact with one another.

19. The device as set forth in claim 14 and further comprising:
   a third layer including the controlled thermal conductivity along the second plane, the third layer is in contact with the first layer and the selected one of the plurality of layers, the third layer is a selected one of inset in the selected one of the plurality of layers or positioned on a surface of the selected one of the plurality of layers, and
   wherein the third layer is operative to further inhibit waste heat transfer through the selected one of the plurality of layers to the enclosure.

20. The device as set forth in claim 19, wherein the third layer includes a portion in which a material of the third layer has been removed.

21. The device as set forth in claim 14, wherein the second layer includes a portion in which a material of the second layer has been removed.

22. The device as set forth in claim 14, wherein the first layer is electrically connected to a ground potential.

23. A device for uniformly distributing waste heat from a heat source to an enclosure, comprising:
   a first layer including a first thermal conductivity along a first plane substantially parallel to a surface of the enclosure, the first layer is in thermal communication with the heat source; and
   a plurality of layers of materials in contact with an external surface of the enclosure, the plurality of layers including a controlled thermal conductivity along a second plane substantially normal to the external surface;
   a selected one of the plurality of layers includes a lowest of the controlled thermal conductivities and a portion of the first layer and the enclosure are positioned between the heat source and the selected one of the plurality of layers, and
   wherein waste heat transfer through the selected one of the plurality of layers to the enclosure is substantially inhibited and a majority of the waste heat is thermally transferred through the first layer and the enclosure along the first plane where the controlled thermal conductivities of the plurality of layers uniformly distribute the waste heat on a surface formed by the plurality of layers.

24. The device as set forth in claim 23, wherein the first layer is made from a material including a high thermal conductivity in the first plane and the material is selected from the group consisting of a thermal heat spreader material, a thermal heat spreader material comprising graphite, and a thermally conductive metal.

25. The device as set forth in claim 23, wherein a selected one or more of the plurality of layers is made from a material including a low thermal conductivity in the second plane and the material is selected from the group consisting of a thermal insulating material, a thermal insulating material comprising an aerogel, and a thermal insulating material comprising a silica aerogel.

26. The device as set forth in claim 23 and further comprising:
   a cover layer in contact with the plurality of layers of materials.

27. The device as set forth in claim 23 and further comprising an EMI shield and the EMI shield is connected with a selected one of the enclosure and the plurality of layers or the heat source and the first layer.

28. The device as set forth in claim 23, wherein the thermal communication between the heat source and the first layer is through a selected one of a gap between the heat source and the first layer, a contact of the heat source with the first layer, or a layer of a thermal interface material in contact with the heat source and the first layer.

29. The device as set forth in claim 23, wherein the plurality of layers are in contact with one another.

30. The device as set forth in claim 23, wherein the first layer includes a portion in which a material of the first layer has been removed.

31. The device as set forth in claim 23, wherein a selected one or more of the plurality of layers of material includes a portion in which a material of the selected layer has been removed.

32. The device as set forth in claim 23, wherein the first layer is electrically connected to a ground potential.

* * * * *

UNITED STATES PATENT AND TRADEMARK OFFICE
CERTIFICATE OF CORRECTION

PATENT NO.       : 7,228,894 B2
APPLICATION NO.  : 10/836511
DATED            : June 12, 2007
INVENTOR(S)      : David A. Moore et al.

It is certified that error appears in the above-identified patent and that said Letters Patent is hereby corrected as shown below:

In column 1, line 54, after "verification," delete "if" and insert -- in --, therefor.

In column 6, line 18, after "can be" insert -- by --.

In column 12, line 46, in Claim 14, delete "the;" and insert -- the enclosure; --, therefor.

Signed and Sealed this

Third Day of November, 2009

David J. Kappos
*Director of the United States Patent and Trademark Office*